(12) United States Patent
Nikai et al.

(10) Patent No.: US 7,456,776 B2
(45) Date of Patent: Nov. 25, 2008

(54) ANALOG-TO-DIGITAL CONVERTER CIRCUIT AND SIGNAL PROCESSING CIRCUIT

(75) Inventors: Norihiro Nikai, Fukuoka (JP); Isamu Izumimoto, Kuwana (JP)

(73) Assignee: Sanyo Electric Co., Ltd., Gifu (JP)

( * ) Notice: Subject to any disclaimer, the term of this patent is extended or adjusted under 35 U.S.C. 154(b) by 0 days.

(21) Appl. No.: 11/693,561

(22) Filed: Mar. 29, 2007

(65) Prior Publication Data

US 2007/0229339 A1   Oct. 4, 2007

(30) Foreign Application Priority Data

Mar. 31, 2006   (JP) .............................. 2006-098982

(51) Int. Cl.
*H03M 1/38* (2006.01)

(52) U.S. Cl. ..................... 341/161; 341/155

(58) Field of Classification Search .................. 341/120, 341/155, 161

See application file for complete search history.

(56) References Cited

U.S. PATENT DOCUMENTS

| | | | |
|---|---|---|---|
| 5,274,377 A * | 12/1993 | Matsuura et al. ............ | 341/161 |
| 6,489,904 B1 * | 12/2002 | Hisano ........................ | 341/120 |
| 7,002,506 B1 * | 2/2006 | Tadeparthy et al. ......... | 341/161 |
| 7,009,548 B2 * | 3/2006 | Chiang et al. ............... | 341/161 |
| 2006/0044172 A1 * | 3/2006 | Sasaki et al. ................ | 341/161 |
| 2006/0061502 A1 * | 3/2006 | Yoshioka et al. ............ | 341/172 |

OTHER PUBLICATIONS

Yoshihisa Fujimoto, et al., "A Switched-Capacitor Variable Gain Amplifier for CCD Imaged Sensor Interface System," Proceedings of the 28th European Solid-State Circuit Conference, Sep. 2002, ESSCIRC 2002, pp. 363-366.

* cited by examiner

*Primary Examiner*—Jean B Jeanglaude
(74) *Attorney, Agent, or Firm*—Ditthavong Mori & Steiner, P.C.

(57) ABSTRACT

In an analog-to-digital converter circuit of pipeline type configured by cascade-connecting a plurality of analog-to-digital conversion blocks, at least analog-to-digital conversion blocks at an initial stage excluding an analog-to-digital conversion block at a final stage have each a function as an amplifier and are switched by a control signal inputted externally so that the analog-to-digital conversion blocks each operates as the amplifier. When the analog-to-digital conversion blocks each having the function as the amplifier are each operated as the amplifier by the control signal, a digital signal is generated by using data outputted from an analog-to-digital conversion block provided subsequent to the analog-to-digital conversion blocks operating as the amplifiers.

9 Claims, 4 Drawing Sheets

"L": (DL, DM, DHJ) = (1, 0, 0)
"M": (DL, DM, DHJ) = (0, 1, 0)
"H": (DL, DM, DHJ) = (0, 0, 1)

"L": (DL, DM, DHJ) = (1, 0, 0)
"M": (DL, DM, DHJ) = (0, 1, 0)
"H": (DL, DM, DHJ) = (0, 0, 1)

US 7,456,776 B2

ANALOG-TO-DIGITAL CONVERTER CIRCUIT AND SIGNAL PROCESSING CIRCUIT

BACKGROUND OF THE INVENTION

1. Field of the Invention

The present invention generally relates to an analog-to-digital converter circuit and a signal processing circuit, and it particularly relates to a pipeline type analog-to-digital converter circuit and a signal processing circuit using said pipeline-type analog-to-digital converter circuit.

2. Description of the Related Art

As a CCD (Charge-Coupled Device) and a CMOS (Complementary Metal Oxide Semiconductor) sensor have been mounted on portable equipment such as mobile phones, the number of pixels thereof exceeds million pixels and tends to rise continuously. Under such circumstances, both reduced power consumption in the processing and higher precision are demanded for analog front-end (AFE) circuits that process output signals from the image sensors.

As a conventional AFE circuit for use in image sensors, there is a circuit equipped with a function wherein in order to enhance color gradation the gain is varied according to the amplitude of an input signal from the image sensor and an input signal is amplified. That is, when the level of the input signal is small during a certain period of time, this AFE circuit adjusts (amplifies) the signal amplitude thereof by raising the gain and thereby the resolution of a subsequent analog-to-digital (A-D) converter circuit is raised.

In the aforementioned AFE circuit, a variable amplifier circuit for amplifying analog signals needs to be provided before the A-D conversion. However, a problem arises where the variable amplifier circuit may generate noise that degrades the image quality.

SUMMARY OF THE INVENTION

The present invention has been made in view of the aforementioned problems and a general purpose thereof is to provide an analog-to-digital converter circuit which converts an analog signal to a digital signal by amplifying an input analog signal and prevents the effect of noise.

One embodiment of the present invention relates to an analog-to-digital converter circuit. This circuit is an analog-to-digital converter circuit of pipeline type configured by cascade-connecting a plurality of analog-to-digital conversion blocks, wherein at least an analog-to-digital conversion block at an initial stage excluding that at a final stage has a function as an amplifier and is switched by a control signal inputted externally so that the analog-to-digital conversion block operates as the amplifier, and wherein when the analog-to-digital conversion block having the function as the amplifier is operated as the amplifier by the control signal, a digital signal is generated by using data outputted from an analog-to-digital conversion block provided subsequent to the analog-to-digital conversion block operating as the amplifier.

It is to be noted that any arbitrary combination of the above-described structural components and expressions converted among a method, an apparatus, a system and so forth are all effective as and encompassed by the present embodiments.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
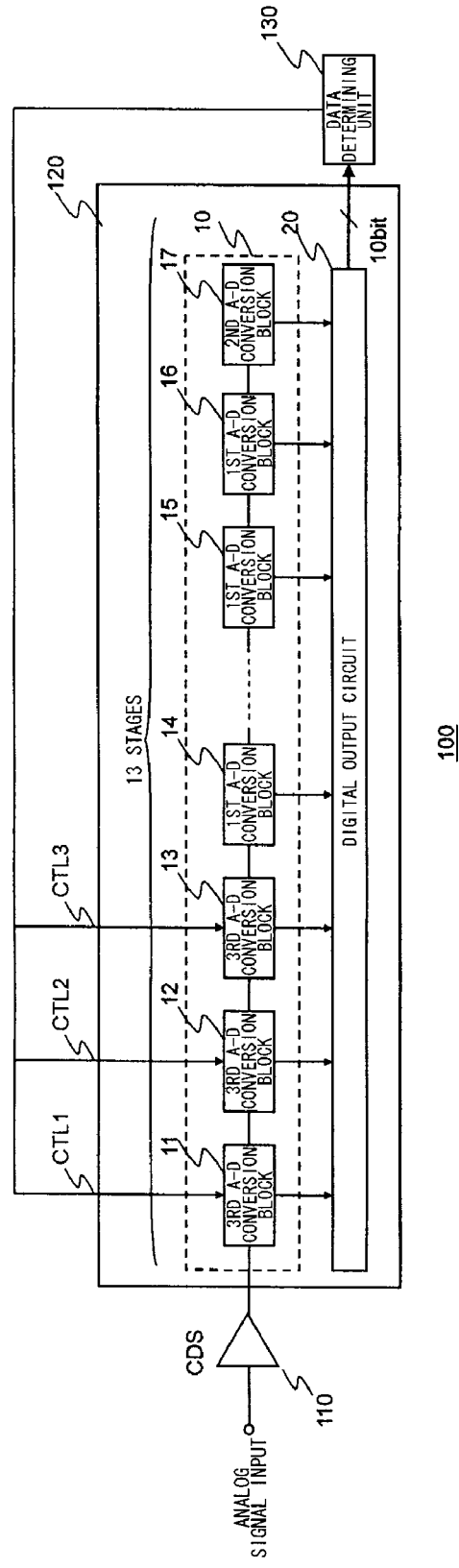
FIG. 1 is a circuit diagram of an AFE circuit according to an embodiment of the present invention.

The invention will now be described by reference to the preferred embodiments. This does not intend to limit the scope of the present invention, but to exemplify the invention.

The present invention will be described hereinbelow based on the preferred embodiments. An embodiment relates to an analog front-end circuit which performs a predetermined processing on an analog output signal of an image sensor (e.g., CCD) so as to convert it into a digital signal.

A description of a typical embodiment will be given before describing a detailed description of the present invention.

One embodiment of the present invention relates to an analog-to-digital converter circuit. This circuit is an analog-to-digital converter circuit of pipeline type configured by cascade-connecting a plurality of analog-to-digital conversion blocks, wherein at least an analog-to-digital conversion block at an initial stage excluding that at a final stage has a function as an amplifier and is switched by a control signal inputted externally so that the analog-to-digital conversion block operates as the amplifier, and wherein when the analog-to-digital conversion block having the function as the amplifier is operated as the amplifier by the control signal, a digital signal is generated by using data outputted from an analog-to-digital conversion block provided subsequent to the analog-to-digital conversion block operating as the amplifier.

According to this embodiment, the analog-to-digital conversion blocks each having a function to operate as an amplifier by the external control signal can be made to function as amplifiers and the digital signals can be generated by using the output data of an analog-to-digital conversion block posterior to the analog-to-digital conversions functioning as amplifiers. Thus, the input analog signal can be converted into the digital signal by amplifying the input analog signal. Also, if a control is performed by using the external control signal so that all of the analog-to-digital conversion blocks function as normal analog-to-digital conversion blocks, digital signals can be generated, from an initial-stage analog-to-digital conversion block or blocks by using the output data of an analog-to-digital conversion block corresponding to a desired number of bits. As a result, there is no need to pass the signal through the amplifier which may be a source of noise, so that the input analog signal can be converted to the digital signal while the noise is being suppressed.

In this embodiment, the digital signal may be generated by using output data of an analog-to-digital conversion block corresponding to the number of bits of the digital signal. The analog-to-digital circuit according to this embodiment assigns part of the analog-to-digital conversion blocks to function as amplifiers, so that more analog-to-digital conversion blocks than those corresponding to the bit accuracy of digital signals generated are required. Accordingly, although this analog-to-digital converter circuit has the resolution corresponding to the number of analog-to-digital conversion blocks, the conversion accuracy can be achieved, the number of bits of digital signal suffices to achieve the conversion accuracy if the digital signals are generated by using the output data of analog-to-digital conversion blocks corresponding to the number of bits of the digital signals. Consequently, there is no need to increase the gain or the accuracy of an operational amplifier itself used in the analog-to-digital conversion circuit or the input capacitance and feedback capacity connected with the operational amplifier, to comply with the resolution of the analog-to-digital circuit. This leads to a reduction in the power consumed.

The analog-to-digital conversion block having a function as an amplifier includes a sub-analog-to-digital converter which converts an analog signal inputted to the analog-to-digital conversion block into a digital signal; a sub-D-A converter which outputs an analog signal corresponding to the digital signal obtained in the sub-analog-to-digital converter; a sample-and-hold circuit which samples the analog signal inputted to the analog-to-digital conversion block, amplifies and holds a sampled signal; and a subtractor which subtracts the analog signal outputted from the sub-D-A converter from the analog signal held by the sample-and-hold circuit, wherein the analog signal outputted from the sub-D-A converter may be fixed to a predetermined level, based on a value of the control signal and the analog signal fixed to the predetermined level may be subtracted from the analog signal amplified by the sample-and-hold circuit.

According to this structure as described above, the analog signal inputted to an analog-to-digital conversion block is amplified and then the amplified signal can be level-shifted by a predetermined level generated in a sub-D-A converter based on the value of a control signal. Thus, after the input analog signal has been amplified, a predetermined voltage range is retrieved and then outputted to the next-stage analog-to-digital converter block. Also, the structure of the analog-to-digital conversion block having the function operating as this amplifier is such that a structure by which to fix the level of analog signal outputted from the sub-D-A converter based on the control signal value is added. Hence, the analog-to-digital conversion block equipped with a function operating as an amplifier can be configured easily and readily.

When a reference voltage range of one analog-to-digital conversion block in the plurality of analog-to-digital conversion blocks is denoted by VR1, a resolution is denoted by N, a reference voltage range of a next-stage A-D conversion block is denoted by VR2, the gain of a sample-and-hold circuit included in the one A-D conversion block may be equal to $(VR2/VR1) \times 2^{-A}$ where A is an integer such that all decimal points of N are truncated.

Another embodiment of the present invention relates to a signal processing circuit. This circuit comprises: an analog-to-digital conversion circuit according to any one of embodiments of the present invention; and a data determination unit which determines a data range that a digital signal outputted from said analog-to-digital converter takes and which generates the control signal, based on the data range.

According to this embodiment, the range of data that the digital signal takes is determined based on a digital signal converted from an analog signal by the analog-to-digital converter. As a result, the range of voltage within which the analog signal varies can be estimated. Based on this determination result, a control is performed so that it is determined whether an analog-to-digital conversion block having a function of an amplifier is operated to function as an analog-to-digital conversion block or an amplifier. Hence, the resolution of an analog-to-digital converter circuit can be adjusted to a voltage range within which the analog signal varies.

FIG. 1 is a circuit diagram of an analog front end (AFE) circuit 100 according to an embodiment of the present invention. The AFE circuit 100 is comprised of a correlated double sampling (CDS) circuit 110, an analog-to-digital (A-D) converter circuit 120, and a data determination unit 130.

The CDS circuit 110 receives an output signal from an image sensor, retrieves from the signal a voltage corresponding to an image signal, and outputs the voltage as an analog image signal.

The A-D converter circuit 120 converts the analog image signal outputted from the CDS circuit 110, into a 10-bit digital signal. The A-D converter circuit 120 also has a function of extracting a signal contained in a predetermined voltage range, from within the inputted analog image signal, and performing A-D conversion in a range of the extracted signal.

The A-D converter circuit 120 is a pipeline structured A-D converter circuit and it is comprised of a group of A-D conversion blocks 10, in which 13-stage A-D conversion blocks are cascade-connected, and a digital output unit 20.

A-D conversion blocks included in the group of A-D conversion blocks 10 are classified into three kinds of blocks which are a first A-D conversion block, a second A-D conversion block and a third A-D conversion block. Initial-stage to third-stage A-D conversion block 11 to 13 are each constituted by the third A-D conversion block, whereas the last-stage A-D conversion block 17 is constituted by the second A-D converter block. The other-stage A-D conversion blocks 14 to 16 are each constituted by the first A-D conversion block. Hereinbelow, a description will be given of structures of the first A-D conversion block 14, the second A-D conversion block 17 and the third A-D conversion block 11.

Figure 2A:
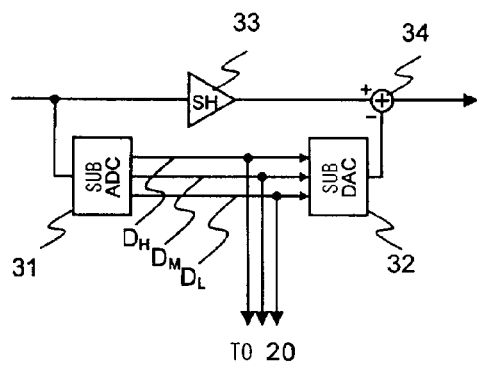
FIG. 2A illustrates a structure of a first A-D conversion block shown in FIG. 1.

FIG. 2A illustrates a structure of the first A-D conversion block 14. The first A-D conversion block 14 includes a first sub-A-D converter 31, a sub-D-A converter 32, a sample-and-hold circuit 33 and a subtractor 34.

The first sub-A-D converter 31 has the resolution of 1.5 bit and generates output data (DL, DM, DH) from an analog signal inputted to the first A-D conversion block 14. The output data (DL, DM, DH) indicate which voltage range input analog signal belongs to. More specifically, let the voltage range of an analog signal inputted to the first A-D conversion block be −VR to +VR; if the level of an input analog signal is approximately greater than or equal to −VR and less than or equal to −VR/4, (DL, DM, DH)=(1, 0, 0) will be outputted as the output data; if the level of an input analog signal is approximately greater than or equal to −VR/4 and less than or equal to +VR/4, (DL, DM, DH)=(0, 1, 0) will be outputted as the output data; and if the level of an input analog signal is approximately greater than or equal to +VR/4 and less than or equal to +VR, (DL, DM, DH)=(0, 0, 1) will be outputted as the output data. The output data (DL, DM, DH) is outputted to the digital output unit 20 as well as the sub-D-A converter 32.

The sub-D-A converter 32 receives the output data (DL, DM, DH) of the first sub-A-D converter 31 and then outputs a predetermined voltage as an analog signal. That is, if the output data (DL, DM, DH) of the first sub-A-D converter 31 is (1, 0, 0), the sub-D-A converter 32 will output a voltage of −VR; if the output data (DL, DM, DH) thereof is (0, 1, 0), the sub-D-A converter 32 will output a voltage of ±0 V; and if the output data (DL, DM, DH) thereof is (0, 0, 1), the sub-D-A converter 32 will output a voltage of +VR. The output of the sub-D-A converter 32 is inputted to a subtraction-value input terminal of the subtractor 34.

The sample-and-hold circuit 33 samples the analog signal inputted to the first A-D conversion block 14 and holds it for a time duration necessary for the processing at least by the first sub-A-D converter 31 and the sub-D-A converter 32. The sample-and-hold circuit 32 has a function to amplify the input analog signal by a factor of 2. The analog signal which has been amplified by the sample-and-hold circuit 33 by a factor of 2 and held therein is inputted to the subtracted-value input terminal of the subtractor 34.

The subtractor 34 subtracts the analog signal inputted from the sub-A-D converter 32, from the analog signal inputted from the sample-and-hold circuit 33. The first A-D conversion block 14 outputs the result of the subtractor 34 to the next-stage A-D conversion block.

Figure 2B:
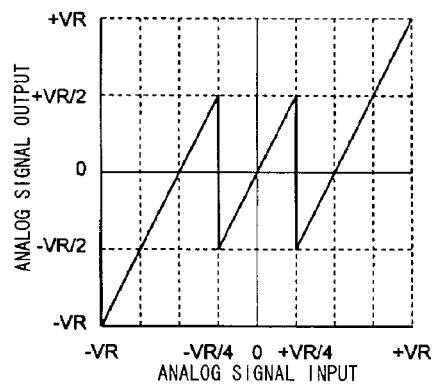
FIG. 2B illustrates a relationship between an input analog signal and an output analog signal of the first A-D conversion block.

FIG. 2B is a graph showing relationships between the input analog signal to the first A-D conversion block 14, the output data (DL, DM, DH) of the first sub-A-D converter 31 and the output analog signal outputted from the subtractor 34. The vertical axis of the graph represents the level of an output analog signal and the horizontal axis represents the level of an input analog signal, where the voltage range thereof is each −VR to +VR.

If the level of an input analog signal is approximately greater than or equal to −VR and less than or equal to −VR/4, the first A-D conversion 14 will output (DL, DM, DH)=(1, 0, 0) as the output data and then convert it into an analog signal whose range is −VR to +VR/2 so as to be outputted. If the level of an input analog signal is approximately greater than or equal to −VR/4 and less than or equal to +VR/4, the first A-D conversion 14 will output (DL, DM, DH)=(0, 1, 0) as the output data and then convert it into an analog signal whose range is −VR/2 to +VR/2 so as to be outputted. If the level of an input analog signal is approximately greater than or equal to +VR/4 and less than or equal to +VR, the first A-D conversion 14 will output (DL, DM, DH)=(0, 0, 1) as the output data and then convert it into an analog signal whose range is −VR/2 to +VR so as to be outputted.

Upon receipt of the analog signal from a previous-stage first A-D conversion block, the first A-D conversion block 15, which is configured the same way as with the first A-D conversion block 14, generates output data (DL, DM, DH) and an output analog signal. Similarly, upon receipt of the analog signal from an anterior-stage A-D conversion block, the first A-D conversion block 16, which is configured the same way as with the first A-D conversion block 14, generates output data (DL, DM, DH) and an output analog signal.

The first A-D conversion blocks 15 and 16 have each the same structure as the first A-D conversion block 14 shown in FIG. 2A. However, the resolution of the sub-A-D converter and/or the gain of the sample-and-hold circuit for each block may differ from those of the first A-D conversion block 14. Also, since the accuracy required for each block differs, the transistors used and/or the amount of capacitance may be made different. In general, a higher degree of precision is required by the anterior-stage A-D conversion block, so that the anterior-stage A-D conversion block may be configured by using larger transistors or capacitance.

Figure 3:
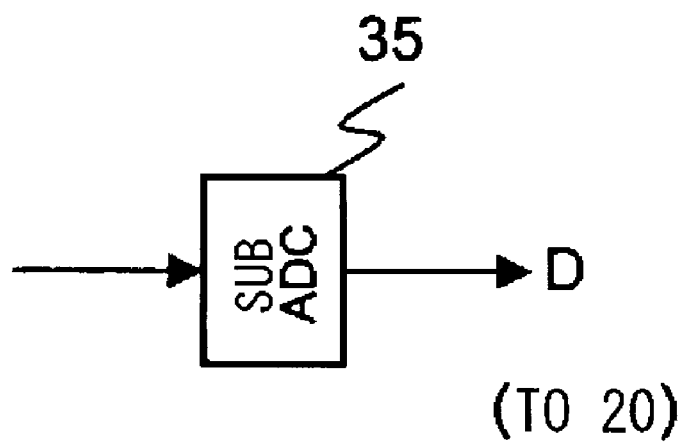
FIG. 3 illustrates a structure of a second A-D conversion block shown in FIG. 1.

FIG. 3 illustrates a structure of the second A-D conversion block 17. The second A-D conversion block 17 includes a second sub-A-D converter 35. The second sub-A-D converter 35 of FIG. 3 is an A-D converter, having the resolution of 1 bit, which outputs D="0" if the level of an input analog signal is approximately greater than or equal to −VR and less than or equal to 0 and which outputs D="1" if the level of an input analog signal is approximately greater than or equal to 0 and less than or equal to VR. Note that the second sub-A-D converter 35 may have a resolution other than 1 bit. For instance, there may be provided an A-D converter having a 1.5-bit resolution. In such a case, it may have the same structure as the first A-D converter.

Figure 4A:
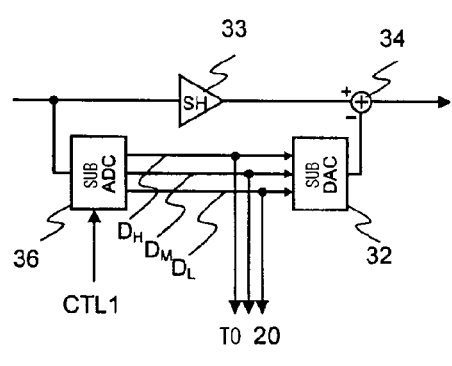
FIG. 4A illustrates a structure of a third A-D conversion block shown in FIG. 1.

FIG. 4A illustrates a structure of the third A-D conversion block 11. The structure of the third A-D conversion block 11 is such that the first sub-A-D converter 31 in the first A-D conversion block 14 is replaced with the third sub-A-D converter 36. The other components including a sub-D-A converter 32, a sample-and-hold circuit 33 and a subtractor 34 are the same as those in the first A-D conversion block 14, so that the repeated description thereof is omitted here.

Similar to the first sub-A-D converter 31, the third sub-A-D converter 36 has the resolution of 1.5 bits and generates output data (DL, DM, DH) from the analog signal inputted to the third A-D conversion block 11. A control signal CTL1 of 2 bits generated in a data determination unit 130 described later is inputted to the third sub-A-D converter 36. And the value of the output data (DL, DM, DH) is controlled by the value of the control signal CTL1 so that it is fixed regardless of the level of the input analog signal.

For example, when the control signal CTL1 is "00", the output data (DL, DM, DH) is outputted as (1, 0, 0). When the control signal CTL1 is "01", the output data (DL, DM, DH) is outputted as (0, 1, 0); and when the control signal CTL1 is "10", the output data (DL, DM, DH) is outputted as (0, 0, 1). Similar to the first sub-A-D converter 31, when the control signal CTL1 is "11", the level of the output data (DL, DM, DH) is determined according to the level of the input analog signal.

The sub-D-A converter 32, the sample-and-hold circuit 33 and the subtractor 34 perform the same operations as those of the respective components in the first A-D conversion block, regardless of the value of the control signal CTL1. However, if the output data (DL, DM, DH) is fixed by the third sub-A-D converter 36, the sub-D-A converter 32 will also output a predetermined voltage, as an analog signal, according to the output data (DL, DM, DH). That is, if the control signal CTL1 indicates values other than "11" regardless of the level of input analog signal to the third sub-A-D converter 36, a constant level of analog signal will be outputted from the sub-D-A converter 32.

Thus, if the control signal CTL1 indicates values other than "11", a constant level of analog signal will be inputted to the subtraction-value-side terminal of the subtractor 34 and therefore the subtractor 34 will operate as a level shift circuit.

Figure 4B:
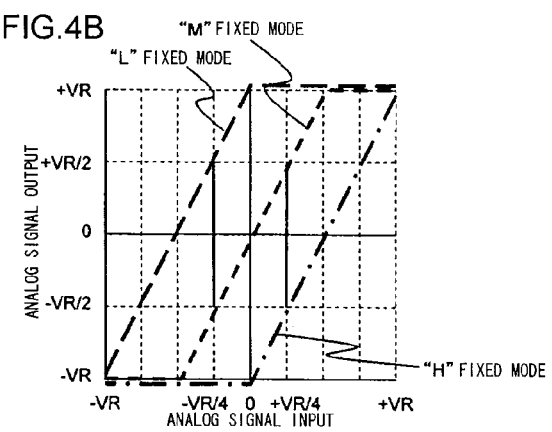
FIG. 4B illustrates a relationship between an input analog signal to a third A-D conversion block of FIG. 1 and an output analog signal therefrom in a case where the value of a control signal is other than "11".

FIG. 4B illustrates a relationship among an analog signal to the third A-D conversion block 11, the output data (DL, DM, DH) of the first sub-A-D converter 31 and an output analog signal outputted from the subtractor 34 in a case where the value of the output data (DL, DM, DH) is fixed by the control signal CTL1. In FIG. 4B, the vertical axis represents the level of an output analog signal and the horizontal axis represents the level of an input analog signal, where the voltage range thereof is each −VR to +VR.

For example, if the output data (DL, DM, DH) is fixed to (1, 0, 0), the input analog signal of approximately greater than or equal to −VR and less than or equal to ±0 is converted into a voltage in the range of −VR to VR and then outputted. Also, if the output data (DL, DM, DH) is fixed to (0, 1, 0), the input analog signal of approximately greater than or equal to −VR/2 and less than or equal to +VR/2 is converted into a voltage in the range of −VR to VR and then outputted. Also, if the output data (DL, DM, DH) is fixed to (0, 0, 1), the input analog signal of approximately greater than or equal to ±0 and less than or equal to VR is converted into a voltage in the range of −VR to VR and then outputted.

This is equivalent to that the input analog signal of approximately greater than or equal to −VR and less than or equal to ±0, approximately greater than or equal to −VR/2 and less than or equal to +VR/2, or approximately greater than or equal to ±0 and about less than or equal to +VR is each amplified by a factor of 2, is each level-shifted by +VR, ±0 or −VR, respectively, and then outputted. That is, the third A-D conversion block 11 can amplify, by the control signal CTL1, the input analog signal having a predetermined voltage range by a factor of 2, level-shift the amplified signal by a predetermined level and then output the level-shifted signal.

Each of the third A-D conversion blocks 12 and 13 has the same structure as the third A-D conversion block 11, and the control signal CTL2 and the control signal CTL3 are inputted to the third A-D conversion block 12 and the third A-D conversion block 13, respectively. Thus, if the output data (DL, DM, DH) of the third A-D conversion blocks 11 and 12 are fixed by the control signals CTL1 and CTL2, respectively, the input analog signal from the CDS 110 will be level-shifted so as to be amplified by a factor of 4. Also, if the output data (DL, DM, DH) of the third A-D conversion blocks 11 to 13 are fixed by the control signals CTL1, CTL2 and CTL3, respectively, the input analog signal from the CDS 110 will be level-shifted so as to be amplified by a factor of 8.

Note that the resolutions of sub-A-D converters or the gains of sample-and-hold circuits may each differ. Since the accuracies required thereby differ, the transistors used or the amounts of capacitance may be made to differ respectively. In general, a higher degree of accuracy is required by an anterior-stage A-D conversion block. Thus an anterior-stage A-D conversion block may be configured by the use of higher-level transistors or capacitance. Also, the relationship between the value of control signal CTL and the fixed value (DL, DM, DH) may be made to differ according to the resolution of a sub-A-D converter or the gain of a sample-and-hold circuit.

The digital output unit 20 generates digital signals of 10 bits, based on the output data (DL, DM, DH) from the first A-D conversion block and the second conversion block and the output data D from the third A-D conversion block.

In so doing, if the control signals CTL1, CTL2 and CTL3 of the third A-D conversion blocks 11, 12 and 13 are each "11", namely, if the third A-D conversion blocks 11, 12 and 13 determine their respective output data (DL, DM, DH) according to the respective levels of the input analog signal, the digital output unit 20 will generate the digital signals of 10 bits by referring to the outputs from ten stages of A-D conversion blocks from the initial-stage third A-D conversion block 11 onward.

If the control signal CTL1 of the third A-D conversion block 11 is a value other than "11" and the control signals CTL2 and CTL3 of the third A-D conversion blocks 12 and 13 are each "11", the third A-D conversion block 11 will function as a 2× amplifier. Hence, the digital output unit 20 generates the digital signals of 10 bits by referring to the outputs from ten stages of A-D conversion blocks starting from the third A-D conversion blocks 12 through the subsequent A-D conversion blocks.

If the control signals CTL1 and CTL2 of the third A-D conversion blocks 11 and 12, respectively, are values other than "11" and the control signal CTL3 of the third A-D conversion block 13 is "11", the third A-D conversion blocks 11 and 12 will each function as a 2× amplifier. Hence, the digital output unit 20 generates the digital signals of 10 bits by referring to the outputs from ten stages of A-D conversion blocks starting from the third A-D conversion block 13 through the subsequent A-D conversion blocks.

If the control signals CTL1, CTL2 and CTL3 of the third A-D conversion blocks 11, 12 and 13, respectively, are values other than "11", the third A-D conversion blocks 11, 12 and 13 will each function as a 2× amplifier. Hence, the digital output unit 20 generates the digital signals of 10 bits by referring to the outputs from ten stages of A-D conversion blocks starting from the first A-D conversion block through the subsequent A-D conversion blocks.

Each bit of digital signals corresponds to each of the A-D conversion blocks to be referred to. And the value of each bit is determined according to the output data of the corresponding A-D conversion block. The MSB of the digital signals is brought into correspondence with an A-D conversion block, closest to the CDS circuit 110, among the A-D conversion blocks to be referred to. The LSB of the digital signals is brought into correspondence with an A-D converter block, farthest from the CDS circuit, among the A-D conversion blocks to be referred to.

Suppose that a certain bit of the digital signals corresponds to a first A-D conversion block or a third A-D conversion block. Now, if the output data (DL, DM, DH) thereof is (1, 0, 0), its bit will be determined as "0"; if the output data (DL, DM, DH) thereof is (0, 0, 1), its bit will be determined as "1"; and if the output data (DL, DM, DH) thereof is (0, 1, 0), the bit will be determined to be a value of bit corresponding to the next-stage A-D converter block.

Where a certain bit of the digital signal corresponds to a second A-D conversion block, if the output data D is "0", its bit will be determined as "0". And if the output data D is "1", its bit will be determined as "1".

The data determination unit 130 analyzes the values of 10-bit digital signals outputted from the digital output unit 20, for a predetermined period of time, and determines the range and the level of the values indicated by the digital signals for the predetermined period of time. Here, the predetermined period of time may be a period segmented in units of time or a period during which a predetermined operation is performed. For example, the predetermined period may be a period during which a screenful of image data comprised of digital signals converted after having being read out of an image sensor are analyzed.

A description will now be given of an operation of the AFE circuit 100, according to the present embodiment, structured as above. In an initial state of the AFE circuit 100, the values of the control signals CTL1, CTL2 and CTL3 are each set to "11". That is, the three first A-D conversion blocks 11, 12 and 13 all function as normal A-D conversion blocks.

A signal outputted from the image sensor is inputted to the CDS circuit 110. The CDS circuit 110 retrieves from the input signal a voltage corresponding to an image signal, and outputs it to the A-D converter circuit 120 as an analog image signal. The A-D converter circuit 120 converts the analog image signal into a 10-bit digital signal.

Then the A-D converter circuit 120 controls the operations of the first A-D conversion blocks 11, 12 and 13 according to the control signals CTL1, CTL2 and CTL3, and A-D converts the input signal as it is or converts the input signal after the input signal is amplified by a factor of 2 to 8 by level-shifting it. The A-D converted 10-bit digital signal is also inputted to the data determination unit 130 where the range of the digital signal indicated in a predetermined duration is determined.

A description will now be given of an operation of the data determining unit 130 in five different cases, separately.

Case when the values of the control signals CTL1, CTL2 and CTL3 are all "11"

If the output range indicated by the digital signal for a predetermined duration exceeds a code 512, the data determining unit 130 so operates that all of values of control signals CTL1, CTL2 and CTL3 retain "11" and returns to the initial state. If the output range indicated by the digital signal becomes less than or equal to the code 512, a preset value "11" of the control signal CTL1 of a first A-D conversion block is cancelled and returns to an initial state by setting the value to any of "00", "11" and "10".

In so doing, if 383 or its neighborhood (i.e., a voltage corresponding to about −VR/4 of the analog signal level) is contained and 639 or its neighborhood (i.e., a voltage corresponding to about VR/4 of the analog signal level) is not contained in the signal range of the digital signal, CTL1 will be set to "00". Similarly, if 383 or its neighborhood is contained and 639 or its neighborhood is contained therein, CTL1 will be set to "01". Similarly, if 383 or its neighborhood is not contained and 639 or its neighborhood is contained therein, CTL1 will be set to "10".

Case when the value of the control signal CTL1 is other than "11" and the values of CTL2 and CTL3 are "11"

If the output range indicated by the digital signal for a predetermined duration exceeds the code 512, the data determining unit 130 so operates that all of values of control signals CTL1, CTL2 and CTL3 are retained and returned to the initial state. If the output range indicated by the digital signal becomes less than or equal to the code 512, a preset value "11" of the control signal CTL2 of a second A-D conversion block is cancelled and returns to an initial state by setting the value to any of "00", "01" and "10".

In so doing, if 383 or its neighborhood is contained and 639 or its neighborhood is not contained in the signal range of the digital signal, CTL2 will be set to "00". If 383 or its neighborhood is contained and 639 or its neighborhood is contained therein, CTL2 will be set to "01". If 383 or its neighborhood is not contained and 639 or its neighborhood is contained therein, CTL2 will be set to "10".

Case when the values of the control signal CTL1 and CTL2 are other than "11" and the value of CTL3 is "11"

If the output range indicated by the digital signal for a predetermined duration exceeds the code 512, the data determining unit 130 so operates that all of values of control signals CTL1, CTL2 and CTL3 are retained and returned to the initial state. If the output range indicated by the digital signal becomes less than or equal to the code 512, a preset value "11" of the control signal CTL3 of a third A-D conversion block is cancelled and returns to an initial state by setting the value to any of "00", "01" and "10".

In so doing, if 383 or its neighborhood is contained and 639 or its neighborhood is not contained in the signal range of the digital signal, CTL3 will be set to "00". If 383 or its neighborhood is contained and 639 or its neighborhood is contained therein, CTL3 will be set to "01". If 383 or its neighborhood is not contained and 639 or its neighborhood is contained therein, CTL3 will be set to "10".

Case when the value "0" occurs frequently in digital signal

The data determining unit 130 converts the values of control signals CTLx (x being one of {1, 2, 3}) of an A-D conversion block provided immediately before an A-D conversion block that outputs the MSB, to "01" or "00" if the signal is "10" or "01", respectively. If the value "0" still occurs frequently after this processing, the same processing is performed on a stage further anterior to the above A-D conversion block and repeats the processing until "0s" do not occur frequently.

Case when the value "1023" occurs frequently in digital signal

The data determining unit 130 converts the values of control signals CTLx (x being one of {1, 2, 3}) of an A-D conversion block provided immediately before an A-D conversion block that outputs the MSB, to "01" or "10" if the signal is "00" or "01", respectively. If the value "1023" still occurs frequently after this processing, the same processing is performed on a stage further anterior to the above A-D conversion block and repeats the processing until "1023" does not occur frequently.

A description has been given so far of an operation and a structure of the AFE circuit 100 according to an embodiment. By employing the AFE circuit 100 according to the present embodiment, the following advantageous effects can be achieved.

(1) In the A-D converter circuit 120 of pipeline type configured by cascade-connecting a plurality of A-D conversion blocks, the A-D conversion blocks comprised of the initial stage to the third stage have a function as a 2× gain amplifier. And the A-D converter circuit 120 has an A-D conversion block, having a function of an amplifier, function as an amplifier, and generates digital signals by using output data of an A-D conversion block provided posterior to the A-D conversion block functioning as an amplifier. Thereby, it is possible to amplify the input analog signal and then convert the thus amplified input analog signal into a digital signal. If there is no need to amplify the input analog signal in the AFE circuit 100, the digital signal can be produced from the initial-stage A-D conversion block by using the output data of an A-D conversion block corresponding to the number of bits required. In such a case, there is no need to pass the signal through the amplifier which may be a source of noise, so that the input analog signal can be converted to the digital signal with high precision.

(2) The A-D converter circuit 120 generates digital signals by using the output data of an A-D conversion block corresponding to the required number of bits. Thus, although the A-D converter circuit 120 has the resolution of 13 bits, the conversion accuracy may be of 10 bits. Consequently, there is no need to increase the gain or the accuracy of an operational amplifier itself used in the sample-and-hold circuit 33 of the A-D conversion circuit 120 or the input capacitance and feedback capacity connected with the operational amplifier, thus leading to a reduction in the power consumed.

(3) If the initial-stage to third-stage A-D conversion blocks function as amplifiers, the analog signal inputted to a subtraction-value-side terminal will be fixed to a predetermined voltage by the value of a control signal. Thus, these A-D conversion blocks also have level-shifting functions. Thereby, it is possible to retrieve a predetermined voltage range from the input analog signal and then amplify it.

(4) The range of data that the digital signal takes is determined by the data determination unit 130. Thereby, the range of voltage and level within which the analog signal varies can be estimated. Based on this determination result, a control is performed so that it is determined whether an A-D conversion block having a function of an amplifier is operated to function as an A-D conversion block or an amplifier. Hence, the resolution of an A-D converter circuit can be adjusted to a voltage range within which the analog signal varies.

The present invention has been described based on the exemplary embodiments. These embodiments are merely exemplary, and it is understood by those skilled in the art that various modifications to the combination of each component and each process thereof are possible and that such modifications are also within the scope of the present invention.

In the above embodiments, an example was shown where A-D converters having the resolution of 1.5 bits or 1 bit are used as sub-A-D converters included in the A-D conversion blocks, respectively. However, an A-D converter included in at least one stage may have the resolution of 2 bits or more. If an A-D converter having the resolution of 2 bits is used, the gain of a sample-and-hold circuit in the same A-D conversion block may be set to 4×. If the reference voltage range of a given A-D conversion block is denoted by VR1, the resolution is denoted by N, the reference voltage range of the next-stage A-D conversion block is denoted by VR2, the gain of a sample-and-hold circuit included in said A-D conversion block may be equal to $(VR2/VR1) \times 2^A$ where A is an integer such that all the decimal points of N are truncated.

In the above embodiments, the number of bits of the digital signal which was subjected to the conversion in the A-D converter circuit 120 is 10, but this should not be considered as limiting. The number of bits of the digital signal may be set to the number of bits required by a digital signal processing circuit at a subsequent stage or a greater number thereof.

In the above embodiments, the number of stages of A-D conversion blocks included in the group of A-D conversion blocks are thirteen and the number of A-D conversion blocks having the functions to operate as amplifiers is three stages but the present embodiment is not limited thereto. The number of stages of A-D conversion blocks having the functions to operate as amplifiers may be determined by the gain obtained in the A-D converter circuit 120. The number of stages of A-D conversion blocks in the group of A-D conversion blocks may be determined by the number of bits of the digital signal which is subjected to the conversion in the A-D converter circuit 120 and the gain obtained in the A-D converter circuit 120.

In the above embodiments, an example was shown where the control signal CTL1 is inputted to the sub-A-D converter 36 in the third A-D conversion block 11 and the output data (DL, DM, DH) are fixed by the value of the control signal CTL1 independently of the level of the input analog signal. The control signal CTL1 may be inputted to the sub-D-A converter 32 and a predetermined level of analog signal may be outputted by the value of the control signal CTL1 independently of the value of the output data of the sub-A-D converter 36. Also, the third A-D conversion blocks 12 and 13 may be configured in the manner.

In the above embodiments, the control signals CTL1, CTL2 and CTL3 are set in sequence or in reverse sequence by the data determining unit 130. However, these signals may be set at the same time based on a range that the digital signal indicates.

In the above embodiments, a description has been given of an AFE circuit that processes the analog output signal of an image sensor, but the application of the present embodiments is not limited thereto. Any signal processing circuit that converts analog signals to digital signals falls within the scope of the present invention. In such a case, the CDS circuit 110 may not be provided at all.

While the preferred embodiments of the present invention have been described using specific terms, such description is for illustrative purposes only, and it is to be understood that changes and variations may be made without departing from the spirit or scope of the appended claims.

What is claimed is:

1. An analog-to-digital converter circuit of pipeline type configured by cascade-connecting a plurality of analog-to-digital conversion blocks, wherein at least an analog-to-digital conversion block at an initial stage excluding that at a final stage is provided with an operation mode in which the block functions as an analog-to-digital converter and an operation mode in which the analog-to-digital conversion block functions as an amplifier and is switched by a control signal inputted externally into one of the operation modes, and wherein when the analog-to-digital conversion block provided with the operation mode in which the block functions as an amplifier is operated as the amplifier by the control signal, a digital signal is generated by using data outputted from an analog-to-digital conversion block provided subsequent to the analog-to-digital conversion block operating as the amplifier.

2. An analog-to-digital converter circuit according to claim 1, wherein the digital signal is generated by using output data of an analog-to-digital conversion block corresponding to the number of bits of the digital signal.

3. An analog-to-digital converter circuit according to claim 1, the analog-to-digital conversion block provided with the operation mode in which the block functions as an amplifier including:

a sub-analog-to-digital converter which converts an analog signal inputted to the analog-to-digital conversion block into a digital signal;

a sub-D-A converter which outputs an analog signal corresponding to the digital signal obtained in the sub-analog-to-digital converter;

a sample-and-hold circuit which samples the analog signal inputted to the analog-to-digital conversion block, amplifies and holds a sampled signal; and a subtractor which subtracts the analog signal outputted from the sub-D-A converter from the analog signal held by the sample-and-hold circuit, wherein the analog signal outputted from the sub-D-A converter is fixed to a predetermined level, based on a value of the control signal and the analog signal fixed to the predetermined level is subtracted from the analog signal amplified by the sample-and-hold circuit.

4. An analog-to-digital converter circuit according to claim 2, the analog-digital conversion block provided with the operation mode in which the block functions as an amplifier including:

a sub-analog-to-digital converter which converts an analog signal inputted to the analog-to-digital conversion block into a digital signal;

a sub-D-A converter which outputs an analog signal corresponding to the digital signal obtained in the sub-analog-to-digital converter;

a sample-and-hold circuit which samples the analog signal inputted to the analog-to-digital conversion block, amplifies and holds a sampled signal; and a subtractor which subtracts the analog signal outputted from the sub-D-A converter from the analog signal held by the sample-and-hold circuit, wherein the analog signal outputted from the sub-D-A converter is fixed to a predetermined level, based on a value of the control signal and the analog signal fixed to the predetermined level is subtracted from the analog signal amplified by the sample-and-hold circuit.

5. An analog-to-digital converter circuit according to claim 3, wherein when a reference voltage range of one analog-to-digital conversion block in the plurality of analog-to-digital conversion blocks is denoted by VR1, a resolution is denoted by N, a reference voltage range of a next-stage A-D conversion block is denoted by VR2, a gain of a sample-and-hold circuit included in the one A-D conversion block is equal to $(VR2/VR1) \times 2^A$ where A is an integer such that all decimal points of N are truncated.

6. An analog-to-digital converter circuit according to claim 4, wherein when a reference voltage range of one analog-to-digital conversion block in the plurality of analog-to-digital conversion blocks is denoted by VR1, a resolution is denoted by N, a reference voltage range of a next-stage A-D conversion block is denoted by VR2, a gain of a sample-and-hold circuit included in the one A-D conversion block is equal to (VR2/VR1)×$2^A$ where A is an integer such that all decimal points of N are truncated.

7. An analog-to-digital converter circuit according to claim 1, wherein, in the plurality of analog-to-digital conversion blocks, an anterior-stage analog-to-digital conversion block is structured by a transistor larger than that used in a posterior-stage analog-to-digital conversion block.

8. An analog-to-digital converter circuit according to claim 2, wherein, in the plurality of analog-to-digital conversion blocks, an anterior-stage analog-to-digital conversion block is structured by a transistor larger than that used in a posterior-stage analog-to-digital conversion block.

9. A signal processing circuit, comprising:
- an analog-to-digital conversion circuit according to claim 1; and
- a data determination unit which determines a data range that a digital signal outputted from said analog-to-digital converter takes and which generates the control signal, based on the data range.

* * * * *